(12) United States Patent
Kong et al.

(10) Patent No.: US 9,171,871 B2
(45) Date of Patent: Oct. 27, 2015

(54) METHOD FOR FABRICATING ARRAY SUBSTRATE FOR FFS MODE LIQUID CRYSTAL DISPLAY DEVICE

(75) Inventors: Min-Suk Kong, Paju-Si (KR); Min-Jic Lee, Paju-Si (KR); Byung-Hyun Lee, Paju-Si (KR)

(73) Assignee: LG Display Co., Ltd., Seoul (KR)

( * ) Notice: Subject to any disclaimer, the term of this patent is extended or adjusted under 35 U.S.C. 154(b) by 149 days.

(21) Appl. No.: 13/336,507

(22) Filed: Dec. 23, 2011

(65) Prior Publication Data

US 2012/0162162 A1  Jun. 28, 2012

(30) Foreign Application Priority Data

Dec. 28, 2010  (KR) .................... 10-2010-0137254

(51) Int. Cl.
| | | |
|---|---|---|
| G09G 5/00 | (2006.01) | |
| H01L 27/12 | (2006.01) | |
| G02F 1/1343 | (2006.01) | |
| G02F 1/1362 | (2006.01) | |
| H01L 29/417 | (2006.01) | |
| G02F 1/1335 | (2006.01) | |

(52) U.S. Cl.
CPC .......... *H01L 27/1288* (2013.01); *G02F 1/1362* (2013.01); *G02F 1/134363* (2013.01); *G02F 1/133514* (2013.01); *G02F 2001/134345* (2013.01); *G02F 2001/134372* (2013.01); *H01L 29/41733* (2013.01)

(58) Field of Classification Search
None
See application file for complete search history.

(56) References Cited

U.S. PATENT DOCUMENTS

| 7,151,583 | B2 * | 12/2006 | Ahn et al. ..................... 349/129 |
|---|---|---|---|
| 2004/0066481 | A1 | 4/2004 | Hong et al. |
| 2005/0092991 | A1 | 5/2005 | Ahn et al. |
| 2006/0138422 | A1 | 6/2006 | Ahn et al. |
| 2006/0290866 | A1 * | 12/2006 | Choi et al. ..................... 349/141 |
| 2008/0129706 | A1 * | 6/2008 | Kim et al. ..................... 345/174 |
| 2008/0180624 | A1 | 7/2008 | Choi et al. |
| 2009/0121983 | A1 * | 5/2009 | Sung et al. ..................... 345/76 |
| 2010/0060628 | A1 * | 3/2010 | Lenssen et al. ............... 345/214 |
| 2010/0157208 | A1 | 6/2010 | Hanne |
| 2010/0225632 | A1 * | 9/2010 | Ma et al. ..................... 345/211 |
| 2011/0273377 | A1 * | 11/2011 | Merz ............................ 345/173 |

FOREIGN PATENT DOCUMENTS

| CN | 1487346 A | 4/2004 |
|---|---|---|
| CN | 101236340 A | 8/2008 |
| CN | 100447645 C | 12/2008 |

OTHER PUBLICATIONS

Office Action issued by the State Intellectual Property Office of China on Dec. 4, 2013, in Chinese Patent Application No. 201110461345.3.

\* cited by examiner

*Primary Examiner* — Nicholas Lee
*Assistant Examiner* — Duane N Taylor, Jr.
(74) *Attorney, Agent, or Firm* — Morgan, Lewis & Bockius LLP

(57) ABSTRACT

An array substrate for a field switching mode liquid crystal display device and a fabrication method thereof are provided. The array substrate for an FFS mode LCD device includes: a plurality of gate lines formed on the substrate; a plurality of data lines arranged to cross the gate lines; a common line formed at the subpixel regions of the substrate; an auxiliary common line formed on the common line; TFTs formed at crossings of the gate lines and the data lines; a protective film formed on the substrate; and a pixel electrode and a common electrode formed on the protective film and connected with the TFTs and the auxiliary common line, respectively.

18 Claims, 13 Drawing Sheets

METHOD FOR FABRICATING ARRAY SUBSTRATE FOR FFS MODE LIQUID CRYSTAL DISPLAY DEVICE

The present disclosure relates to subject matter contained in priority Korean Application No. 10-2010-0137254, filed on Dec. 28, 2010, which is herein expressly incorporated by reference in its entirety.

FIELD OF THE INVENTION

The present invention relates to a liquid crystal display (LCD) device and, more particularly, to an array substrate for a fringe field switching (FFS) mode LCD device and a fabrication method thereof.

DESCRIPTION OF THE RELATED ART

In general, a driving principle of an LCD device uses optical anisotropy and polarization qualities of liquid crystal. Liquid crystal is thin and long, having directionality (or orientation) in a molecular arrangement, and the direction of the molecular arrangement can be controlled by artificially applying an electric field to the liquid crystal.

Thus, when the direction of the molecular arrangement of the liquid crystal is arbitrarily adjusted, the molecular arrangement of the liquid crystal is changed, and light is refracted in the direction of the liquid crystal molecular arrangement by optical anisotropy, thus expressing image information.

Currently, an active matrix (AM) LCD device (referred to as an 'LCD device', hereinafter) in which thin film transistors (TFTs) and pixel electrodes connected with the TFTs are arranged in a matrix form, having excellent resolution and video implementation capability has come to prominence.

The LCD includes a color filter substrate (i.e., an upper substrate) with a common electrode formed thereon, an array substrate (i.e., a lower substrate) with pixel electrodes formed thereon, and liquid crystal filled between the upper and lower substrates. In the LCD device, the liquid crystal is driven by an electric field generated by the common electrode and the pixel electrodes.

However, the driving of liquid crystal by the vertically applied electric field is disadvantageous in that it does not provide good viewing angle characteristics. Thus, in order to overcome the shortcomings, a method for driving liquid crystal by an in-plane field has been proposed, and this method advantageously has excellent viewing angle characteristics.

An IPS mode LCD device includes a color filter substrate and an array substrate formed to face each other, and a liquid crystal layer is interposed therebetween.

Each of a plurality of pixels defined on the array substrate configured as a transparent insulating substrate includes a TFT, a common electrode, and a pixel electrode.

The common electrode and the pixel electrode are spaced apart in parallel on the same substrate.

The color filter substrate configured as a transparent insulating substrate includes black matrixes formed at portions corresponding to gate lines, data lines, and TFTs, and color filters are formed to correspond to the pixels.

The liquid crystal layer is driven by a horizontal field (or in-plane) field) of the common electrode and the pixel electrode.

In the IPS mode LCD device configured as described above, the common electrode and the pixel electrode are formed as transparent electrodes. However, due to the distance between the common electrode and the pixel electrode in terms of design, only the both end portions of the common electrode and the pixel electrode contribute to the enhancement of luminance, resulting in that most of the portions of the common electrode and the pixel electrode block light.

Thus, in order to maximize the luminance enhancement effect, the FFS technique has been proposed.

The FFS technique features that there is no color shift by precisely controlling liquid crystal and a high contrast ratio can be obtained, implementing high screen quality in comparison to the general in-plane technique.

The structure of an array substrate for the related art FFS mode LCD will be described with reference to FIGS. 1 to 3 as follows.

FIG. 1 is a plan view of an array substrate for the related art FSS mode LCD device.

FIG. 2 is a sectional view of the array substrate for the FFS mode LCD device taken along line II-II in FIG. 1.

FIG. 3 is a plan view showing a layout of a gate line, a common line, and a pixel electrode of the array substrate for the related art FSS mode LCD device.

As shown in FIGS. 1 and 2, the array substrate for the related art FSS mode LCD device includes a plurality of gate lines 15c extending in one direction and separated to be parallel to each other on the substrate 11 and a common line 15b disposed to be parallel to the gate line 15c and adjacent to the gate line 15c; a plurality of data lines 21c crossing the gate lines 15c and defining subpixel regions, i.e., red (R), green (G), and blue (B) subpixel regions, at the crossings; pixel electrodes 13 formed at the red (R), green (G), and blue (B) subpixel regions and being adjacent to the common line 15c; and a TFT (T) provided at the crossing of the gate line 15c and the data line 21c and having a gate electrode 15a, an active layer (not shown) (See 19 in FIG. 2), a source electrode 21a, and a drain electrode 21b.

Here, the gate line 15c supplies a scan signal from a gate driver (not shown), and the data line 21c supplies a video signal from a data driver (not shown). The gate line 15c and the data line 21c cross with a gate insulting layer (not shown) interposed therebetween to define the respective pixel regions, i.e., the red (R), green (G), and blue (B) subpixel regions. Here, the red (R), green (G), and blue (B) subpixel regions constitute a unit pixel.

As shown in FIG. 2, the TFT (T) is maintained as a pixel signal supplied to the data line 21c is charged in the pixel electrode 13 by a scan signal supplied to the gate line 15c. To this end, the TFT (T) includes the gate electrode 15a included in the gate line 15c, the source electrode 21a connected with the data line 21c, the drain electrode 21b facing the source electrode 21a and separated from the source electrode 21a, the active layer 19 overlapping with the gate electrode 15a with the gate insulating layer 17 interposed therebetween to form a channel between the source electrode 21a and the drain electrode 21b, and an ohmic-contact layer (not shown) formed on the active layer 19 excluding the channel, and being in ohmic contact with the source electrode 21a and the drain electrode 21b.

The data line 21c receives a pixel signal from the data driver (not shown) through a data pad (not shown).

Also, the transparent pixel electrodes 13 are disposed to be spaced apart from the gate line 15c and the data line 21c on the entire surface of the substrate of the red (R), green (G), and blue (B) subpixel regions constituting a unit pixel. A plurality of bar-like transparent first common electrodes 27a and a second common electrode 27b are disposed at an upper side of the pixel electrode 13 and the data line 21c with a passivation film 23 interposed therebetween.

Here, the plurality of bar-like transparent first common electrodes 27a are disposed to be parallel to the data line 221c, and the first common electrodes 27a are spaced apart by a certain interval. Also, both ends of the first and second common electrodes 27a and 27b are connected with the common electrode connection line 27c.

The common electrode connection line 27c is electrically connected with the common line 15b through a common line contact hole (not shown).

Accordingly, the common line 15b and the common electrodes 27a and 27b supply a reference voltage, i.e., a common voltage, for driving liquid crystal to the respective pixels.

The pixel electrodes 13 overlap with the plurality of common electrodes, with the passivation film 23 interposed therebetween, to form a fringe field.

Accordingly, when the video signal is supplied to the pixel electrode 13 through the TFT (T), the common electrodes 27a and 27b to which the common voltage has been supplied form a fringe field, making the liquid crystal molecules arranged in a horizontal direction between the TFT substrate and the color filter substrate (not shown) rotate according to dielectric anisotropy. And, transmittance of light that transmits through the pixel regions vary according to the degree of rotation of the liquid crystal molecules, thus implementing gray scales.

However, in the array substrate for the FFS mode LCD device according to the related art, when the gate electrode is formed, the gate line, the pixel electrode, and the common line Vcom are simultaneously formed, and in this case, in order to prevent an electrical short, the gate line, the common line, and the pixel electrode must be separated by a certain interval or more, resulting in a reduction in an aperture ratio. Namely, as shown in FIG. 3, a distance D1 between the gate line 15c and the pixel electrode 13, a distance D2 between the pixel electrode 13 and the common line 15b, and a distance D3 between the common line 15b and the gate line 15c should be more than a certain interval. However, since the common line 15b is disposed between the pixel electrode 13 and the gate line 10c, if the distance therebetween is close, a short-circuit may occur, so it is impossible to increase the length L of the pixel electrode 13.

Also, after the gate line is formed, the pixel electrode is in a floating state, making it impossible to inspect a short of the gate line, the pixel electrode, the common line, and the pixel electrode.

SUMMARY OF THE INVENTION

An aspect of the present invention provides an array substrate for a fringe field switching (FFS) mode liquid crystal display (LCD) device and a fabrication method thereof capable of increasing the area of a pixel electrode by forming an auxiliary common line parallel to a gate line, thus enhancing an aperture ratio, and inspecting a short of the common line and the gate line.

According to an aspect of the present invention, there is provided an array substrate for a field switching (FFS) mode liquid crystal display (LCD) device, including: a substrate; a plurality of gate lines formed in one direction on one surface of the substrate; a plurality of data lines arranged to cross the plurality of gate lines to define subpixel regions; a common line formed at the subpixel regions of the substrate; an auxiliary common line formed on the common line and disposed to be parallel to the gate lines; thin film transistors (TFTs) formed at crossings of the gate lines and the data lines; a protective film formed on the entire surface of the substrate and exposing the TFTs and the auxiliary common line; and a pixel electrode and a common electrode formed on the protective film and connected with the TFTs and the auxiliary common line, respectively.

According to another aspect of the present invention, there is provided a method for fabricating an array substrate for a field switching (FFS) mode liquid crystal display (LCD) device, including: forming a plurality of gate lines and common line in one direction on one surface of the substrate and simultaneously forming an auxiliary common line to be parallel to the gate lines on the common line; forming a plurality of data lines arranged to cross the plurality of gate lines to define pixel regions; forming thin film transistors (TFTs) at crossings of the gate lines and the data lines; forming a protective film on the entire surface of the substrate such that it exposes the TFTs and the auxiliary common line; and forming pixel electrodes and common electrodes connected with the TFTs and the auxiliary common line, respectively, on the protective film.

The array substrate for an FFS mode LCD device and a fabrication method thereof according to the present invention have the following advantages.

According to embodiments of the present invention, in the array substrate for an FFS mode LCD device and a fabrication method thereof, a common line, instead of a pixel electrode, is disposed at a lower portion, and the auxiliary common line Vcom disposed at an upper portion of the common line is moved to an electrode bent portion having low transmittance due to generated disclination, thereby removing the necessity of a distance between the gate line and the common line, enhancing the aperture ratio, and after the gate lines are formed, a short of the common line and the gate lines can also be inspected when the gate line is inspected.

Also, according to embodiments of the present invention, in the array substrate for an FFS mode LCD device and a fabrication method thereof, since the pixel electrode is positioned on the uppermost layer, and at the same time, the common electrode Vcom is formed on the data lines, whereby the pixel electrodes perform FFS driving with the underlying common line and the outermost pixel electrode and the common electrode on the data lines perform IPS driving.

According to embodiments of the present invention, in the array substrate for an FFS mode LCD device and a fabrication method thereof, a contact hole allowing the common electrode and the auxiliary common line at the lower end to be in contact is formed only at the blue subpixels having the lowest transmittance, thus maximizing the aperture ratio.

The foregoing and other objects, features, aspects and advantages of the present invention will become more apparent from the following detailed description of the present invention when taken in conjunction with the accompanying drawings.

DETAILED DESCRIPTION OF THE INVENTION

An array substrate for a liquid crystal display (LCD) device according to an embodiment of the present invention will be described with reference to the accompanying drawings.

Figure 1:
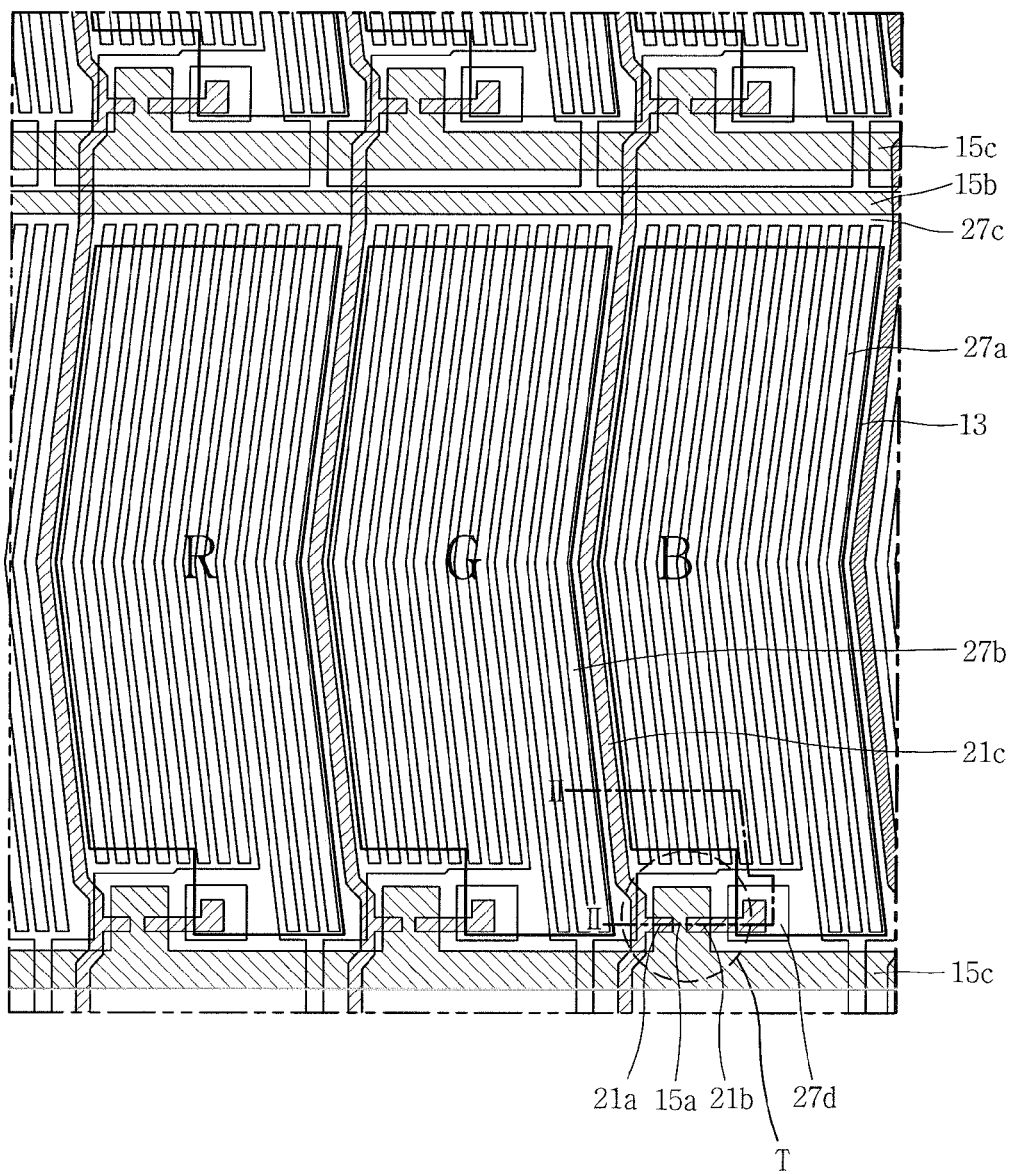
FIG. 1 is a plan view of an array substrate for an FFS mode LCD device according to the related art.
Figure 2:
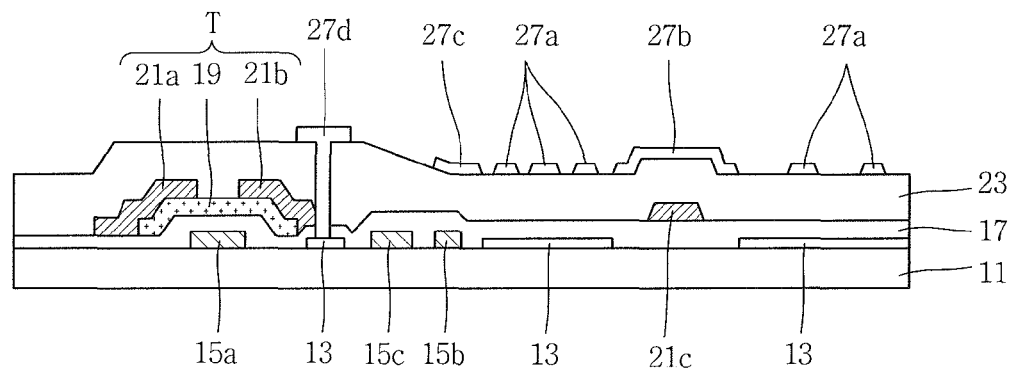
FIG. 2 is a sectional view of the array substrate for an FFS mode LCD device taken along line II-II in FIG. 1.
Figure 3:
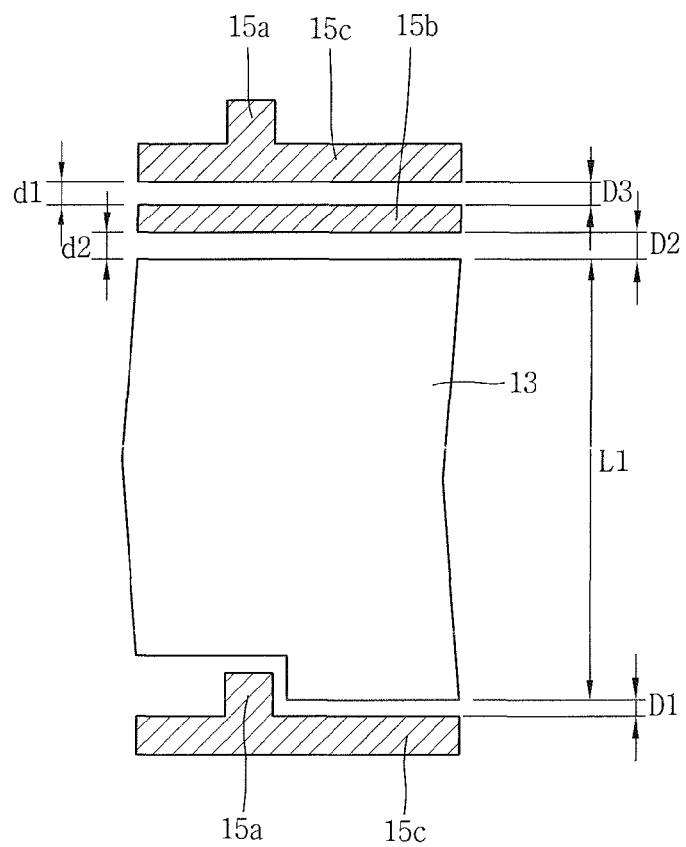
FIG. 3 is a plan view showing a layout of a gate line, a common line, and a pixel electrode of the array substrate for an FFS mode LCD device according to the related art.
Figure 4:
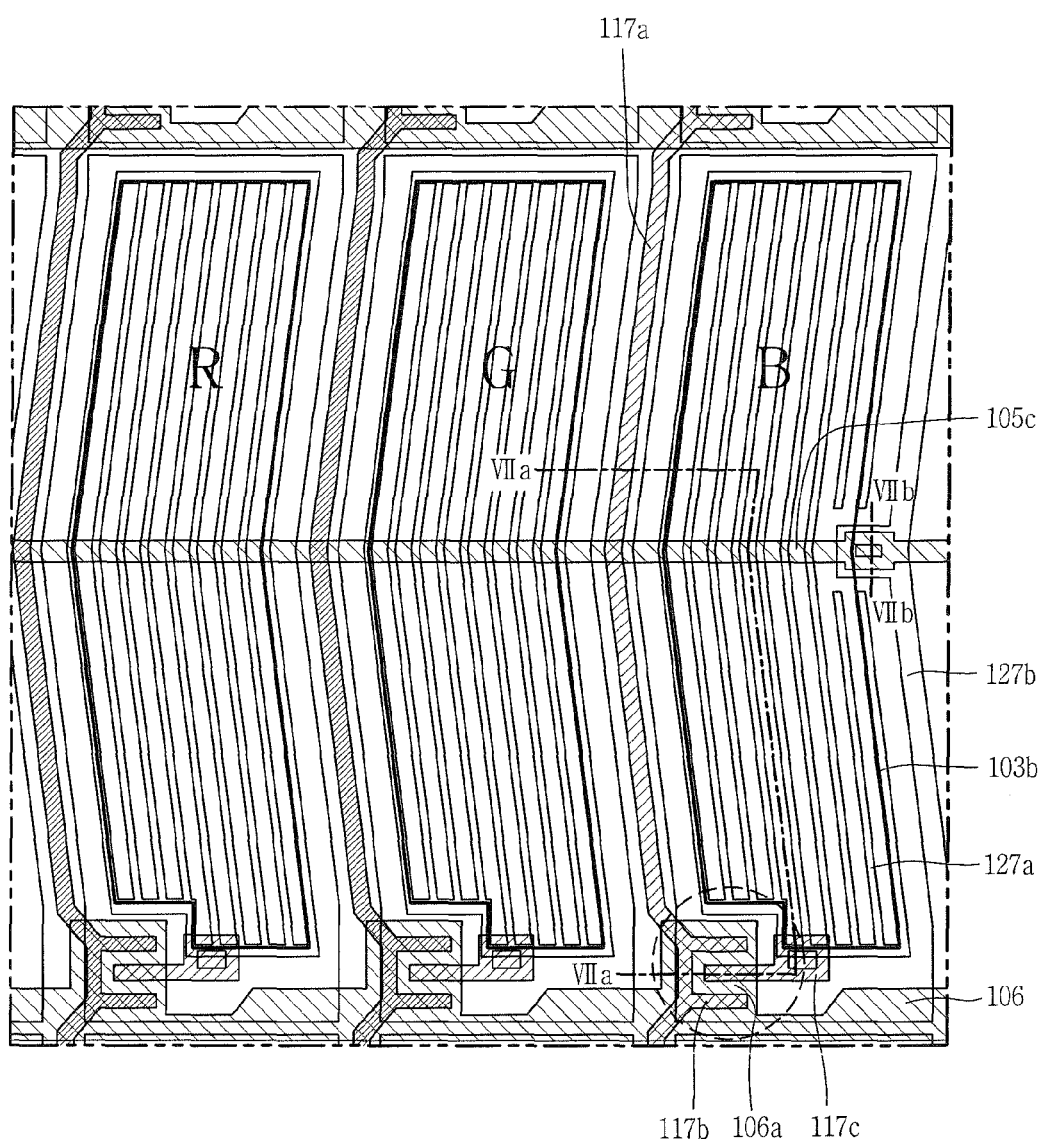
FIG. 4 is a plan view of an array substrate for an FFS mode LCD device according to an embodiment of the present invention.

FIG. 4 is a plan view of an array substrate for an FFS mode LCD device according to an embodiment of the present invention.

Figure 5:
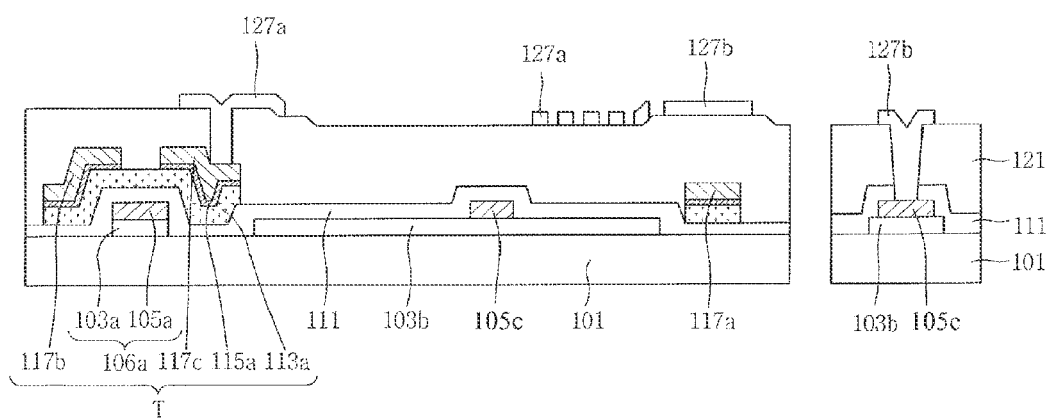
FIG. 5 is a sectional view of the array substrate for an FFS mode LCD device taken along line V-V in FIG. 4.

FIG. 5 is a sectional view of the array substrate for an FFS mode LCD device taken along line V-V in FIG. 4.

Figure 6:
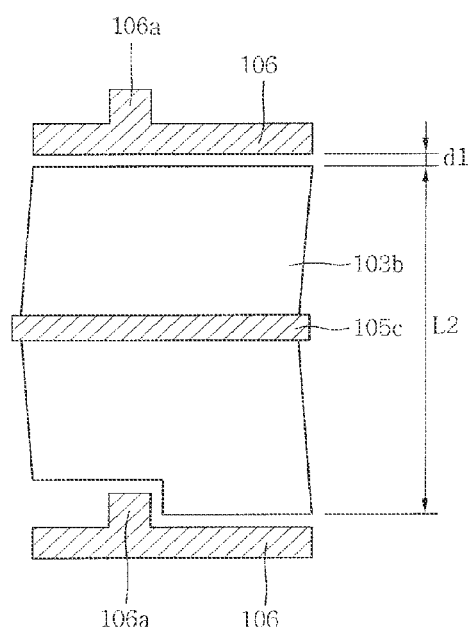
FIG. 6 is a plan view showing a layout of a gate line, a common line, and an auxiliary common line of the array substrate for an FFS mode LCD device according to the present invention.

FIG. 6 is a plan view showing a layout of a gate line, a common line, and an auxiliary common line of the array substrate for an FFS mode LCD device according to the present invention.

As shown in FIGS. 4 and 5, the FFS mode LCD device according to an embodiment of the present invention includes: a plurality of gate lines 106 formed in one direction on one surface of a substrate 101; a plurality of data lines 117a arranged to cross the plurality of gate lines 106 to define red (R), green (G), and blue (B) subpixel regions; a common line 103b formed at the subpixel regions of the substrate 101; an auxiliary common line 105c disposed on the common line 103b and disposed to be parallel to the gate lines 106; thin film transistors (TFTs) T formed at crossings of the gate lines 106 and the data lines 117a; a protective film 121 formed on the entire surface of the substrate and exposing the TFTs and the auxiliary common line 105c; and a pixel electrode 127a and a common electrode 127b formed on the protective film 121 and connected with the TFTs T and the auxiliary common line 105c, respectively.

Here, the gate line 106 supplies a scan signal from a gate driver (not shown), and the data line 117a supplies a video signal from a data driver (not shown). The gate line 106 and the data line 117a cross with a gate insulating layer (not shown) interposed therebetween, defining respective pixel regions, i.e., red (R), green (G), and blue (B) subpixel regions. Here, the red (R), green (G), and blue (B) subpixel regions constitute a unit pixel.

The gate line 106 has a multi-layered structure, i.e., a structure including two or more layers, including a transparent conductive layer or a uni-layered structure on the substrate 101. For example, the gate line 106 may have a multi-layered structure in which a first conductive layer using a transparent conductive layer and a second conductive layer using an opaque metal are stacked, or a uni-layered structure using an opaque metal.

Here, ITO, IZO, or ITZO may be used as a material of the first conductive layer, and Cu, Mo, Al, Cu alloy, Mo alloy, Al alloy, or the like, is used as a material of the second conductive layer.

As shown in FIG. 5, the TFT T is maintained as a pixel signal supplied to the data line 117a is charged in the pixel electrode 127a by a scan signal supplied to the gate line 106. To this end, the TFT includes a gate electrode 106a included in the gate line 106, a source electrode 117b connected with the data line 117a, a drain electrode 117c facing the source electrode 117b and separated from the source electrode 117b, an active layer 113a overlapping with the gate electrode 106A with the gate insulating layer 111 interposed therebetween to form a channel between the source electrode 117b and the drain electrode 117c, and an ohmic-contact layer 115a formed on the active layer 113a excluding the channel, and being in ohmic contact with the source electrode 117b and the drain electrode 117c.

The active layer 113a and the ohmic-contact layer 115a overlap along the data line 117a.

The data line 117a receives a pixel signal from the data driver (not shown) through a data pad (not shown).

A transparent common electrode 103b is formed to be spaced apart from the gate line 106 and the data line 117a on the entire surface of the red (R), green (G), and blue (B) subpixel regions constituting a unit pixel. An auxiliary common line 105c is disposed to be parallel to the gate line 106 on the common line 103b. Here, the auxiliary common line 105c is formed to be moved toward a pixel electrode bent portion having low transmittance due to generated disclination, removing the necessity of a distance between the gate line and the common line, thus enhancing the aperture ratio. Also, the common line 103b is formed on the layer on which the gate line 106 is formed, and is made of a transparent conductive material.

A plurality of pixel electrodes 127a are formed to overlap with the common line 103b with the protective film 121 interposed therebetween, and the common electrode 127b is formed to surround the plurality of pixel electrodes 127a. Here, the common electrode 127b overlaps with the gate line 106 and the data line 117a. Also, the common electrode 127b is connected with the lower auxiliary common line 105c through the contact hole 121b formed only in the blue (B) subpixel having the lowest transmittance, thus maximizing the aperture ratio. Here, the blue (B) subpixel has transmittance lower than that of the red (R) and green (G) subpixels. Thus, in order to compensate for the low transmittance, the blue (B) subpixel may be formed to have a larger area than that of the red (R) and green (G) subpixels. Namely, when the auxiliary common line 105c is formed at the blue (B) subpixel region having the lowest transmittance, since the auxiliary common line 105c is made of an opaque metal material, the transmittance may be degraded. Thus, in order to solve this problem, preferably, the area of the blue (B) subpixel region is formed to be larger than the respective areas of the red (R) pixel region and the green (G) pixel region.

Also, both ends of the plurality of pixel electrodes 127a are connected by a pixel electrode connection line (not shown), and both ends of the plurality of common electrodes 127b are connected by a common electrode connection line (not shown).

The common line 103b, the auxiliary common line 105c, and the common electrode 127b supply a reference voltage, e.g., a common voltage, for driving liquid crystal to each pixel.

Thus, the neighboring pixel electrodes 127a overlap with the lower common line 103b with the protective film 121 interposed therebetween in each pixel region to perform FFS driving, and the pixel electrode 127a and the common electrode 127b on the data line 117a perform IPS driving.

Accordingly, when a video signal is supplied to the pixel electrode 127a through the TFT T, the pixel electrode 127a form FFS or IPS with the common electrode 127b to which a common voltage has been applied, whereby liquid crystal molecules arranged in the horizontal direction between the TFT substrate and the color filter substrate (not shown) rotate according to dielectric anisotropy. A gray scale is implemented as light transmittance of light that transmits through the pixel regions is changed according to the rotation degree of the liquid crystal molecules.

As shown in FIG. 6, in the FFS mode LCD substrate configured as described above according to an embodiment of the present invention, the common line (Vcom), instead of a pixel electrode, is disposed at the lower portion, and the auxiliary common line Vcom 105c disposed at an upper end of the common line 103b is moved to an electrode bent portion having low transmittance due to generated disclination, thereby removing the necessity of a distance between the gate line and the common line, enhancing the aperture ratio, and after the gate lines are formed, a short of the common line and the gate lines can also be inspected.

Accordingly, the common line 103b may be formed to be larger to have a length L2 longer than the length L1 of the related art at the distance secured to be large by the region where the existing common line was present, thus increasing the aperture ratio as much.

A method for fabricating an array substrate for an FFS mode LCD device according to an embodiment of the present invention will be described with reference to FIGS. 7A to 7V.

Figure 7A:
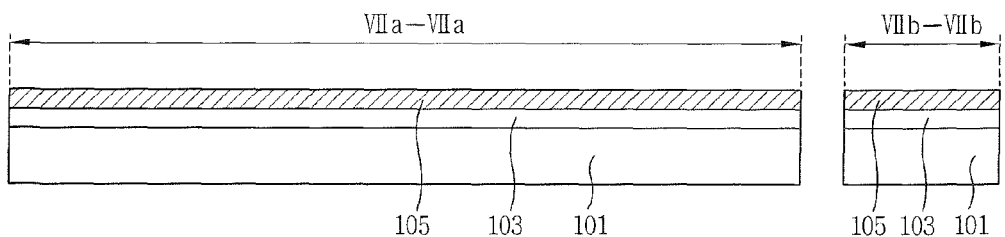
FIGS. 7A to 7V are sectional views showing the process of fabricating the array substrate for an FFS mode LCD device taken along lines VIIa to VIIa and VIIb to VIIb.
Figure 7B:
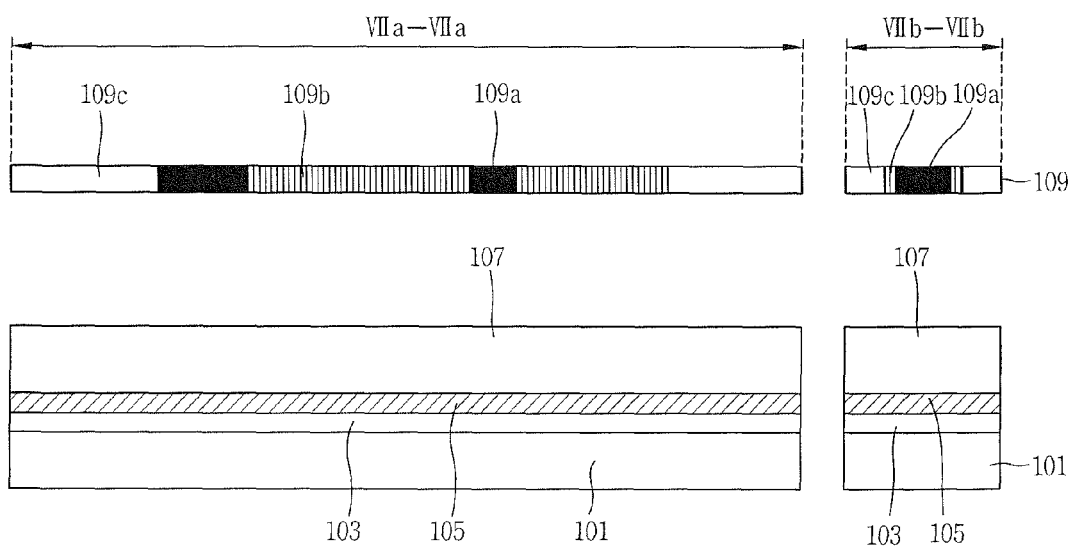
Figure 7C:
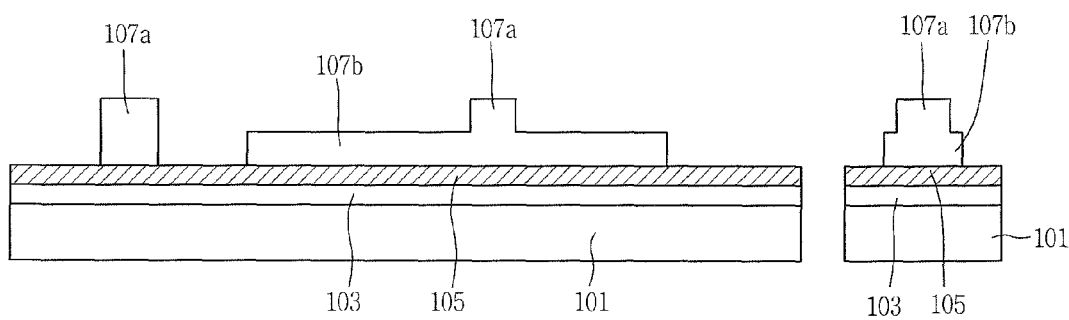
Figure 7D:
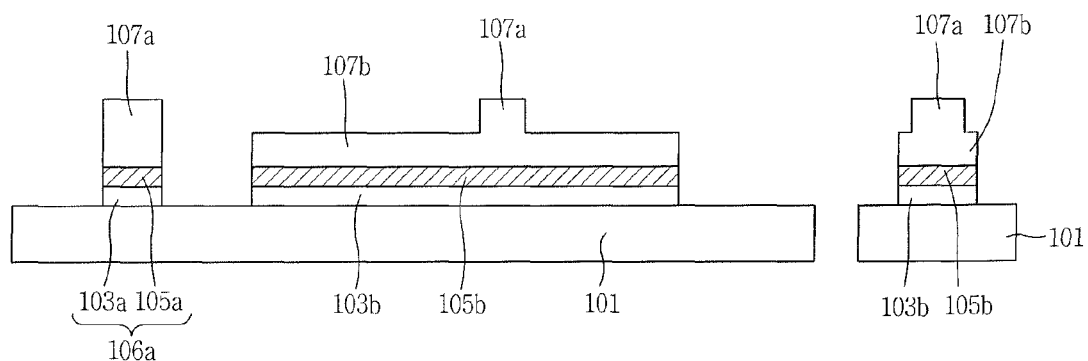
Figure 7E:
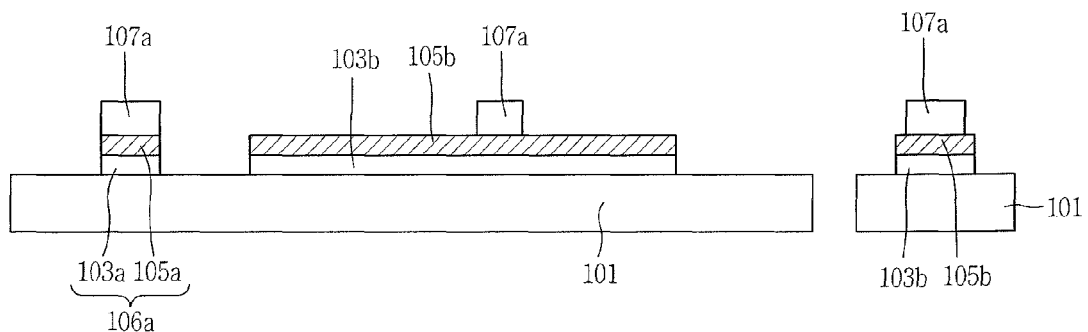
Figure 7F:
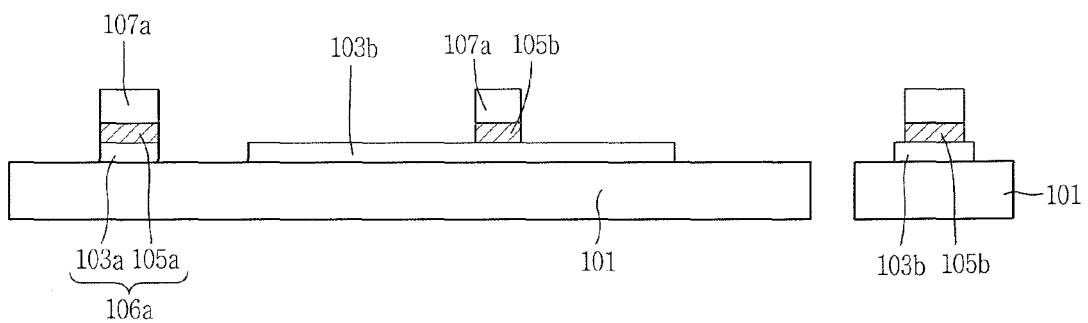
Figure 7G:
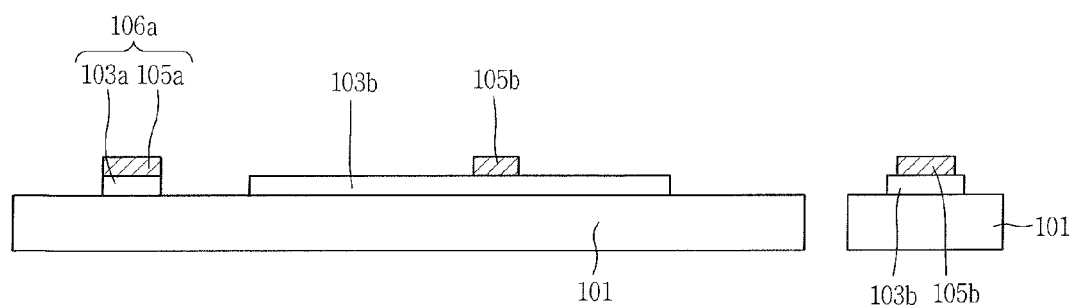
Figure 7H:
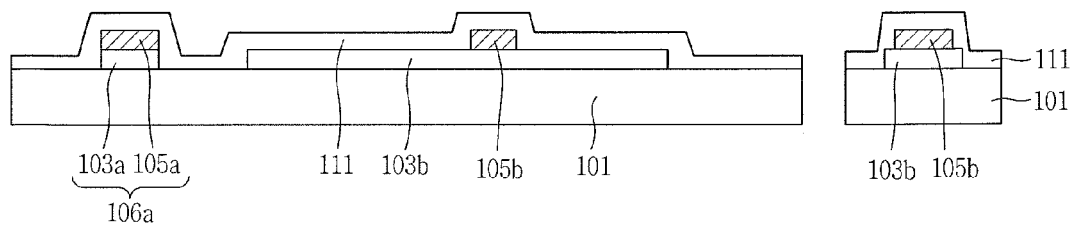
Figure 7I:
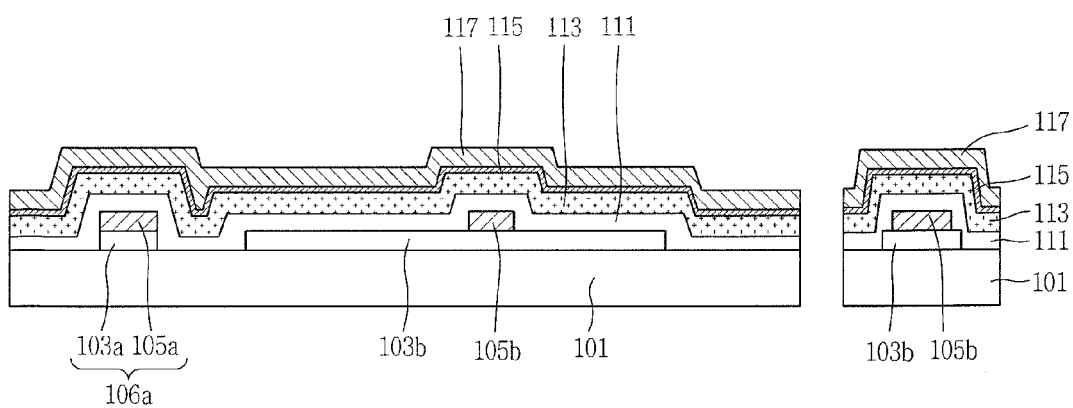
Figure 7J:
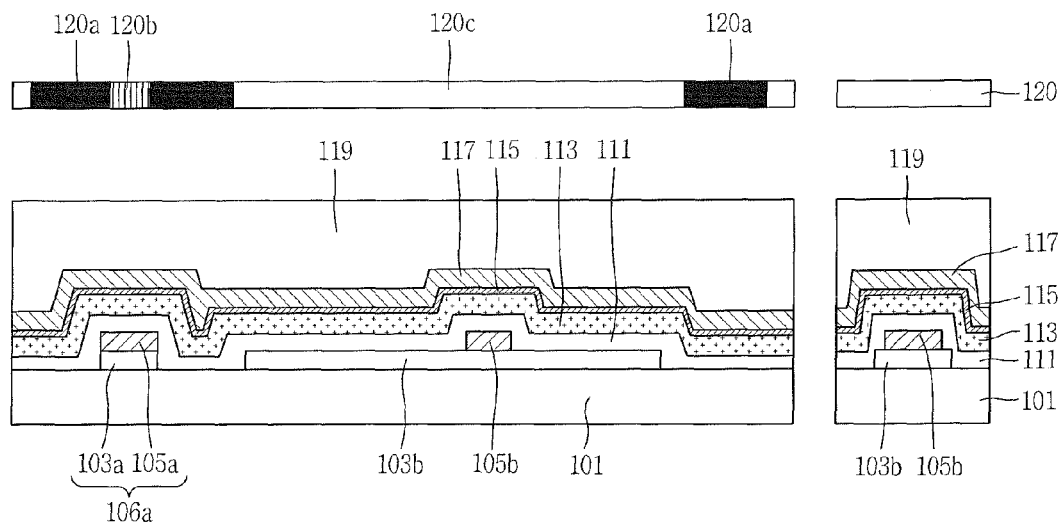
Figure 7K:
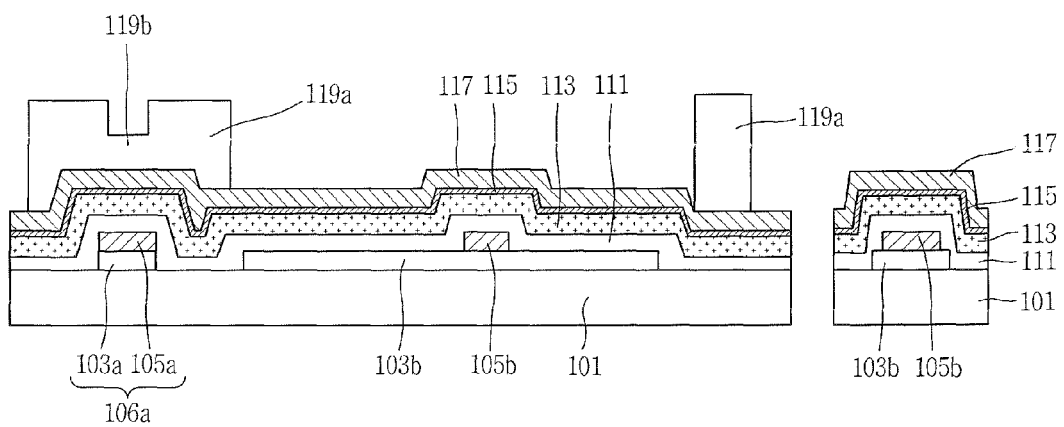
Figure 7L:
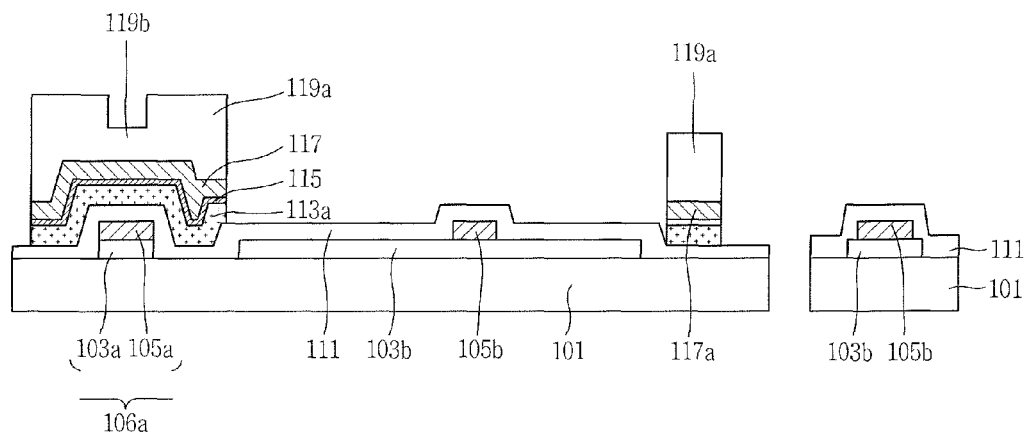
Figure 7M:
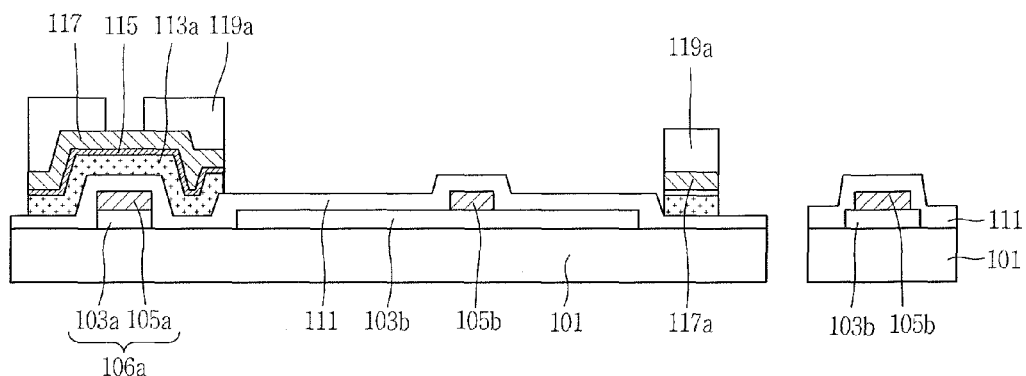
Figure 7N:
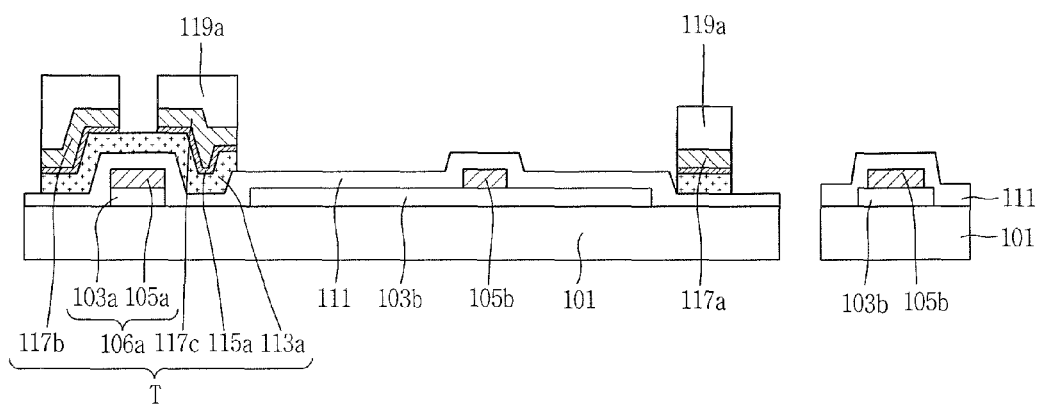
Figure 7O:
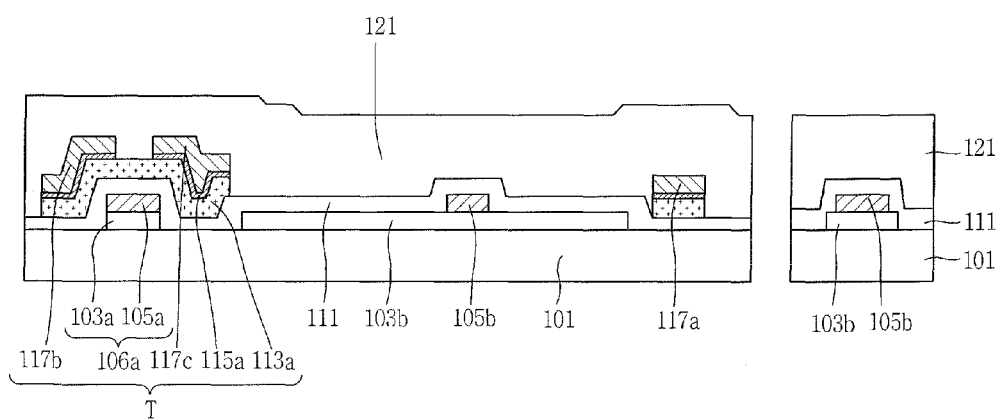
Figure 7P:
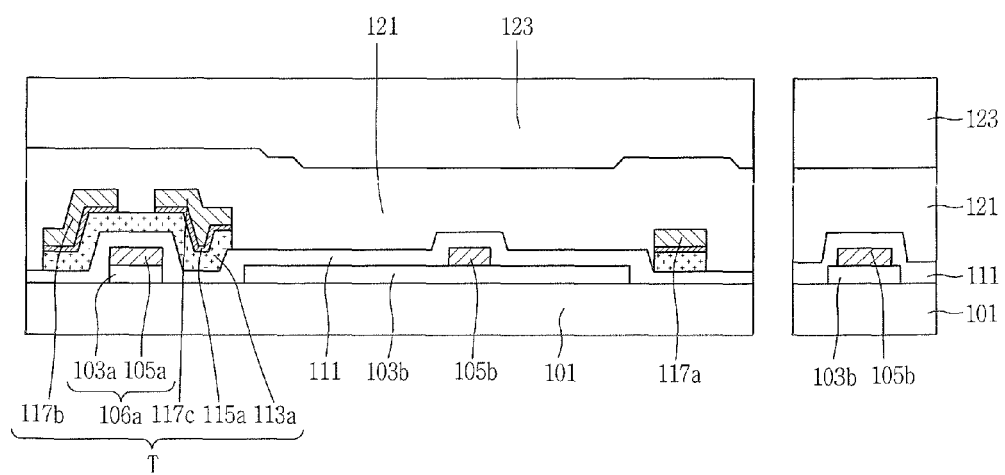
Figure 7Q:
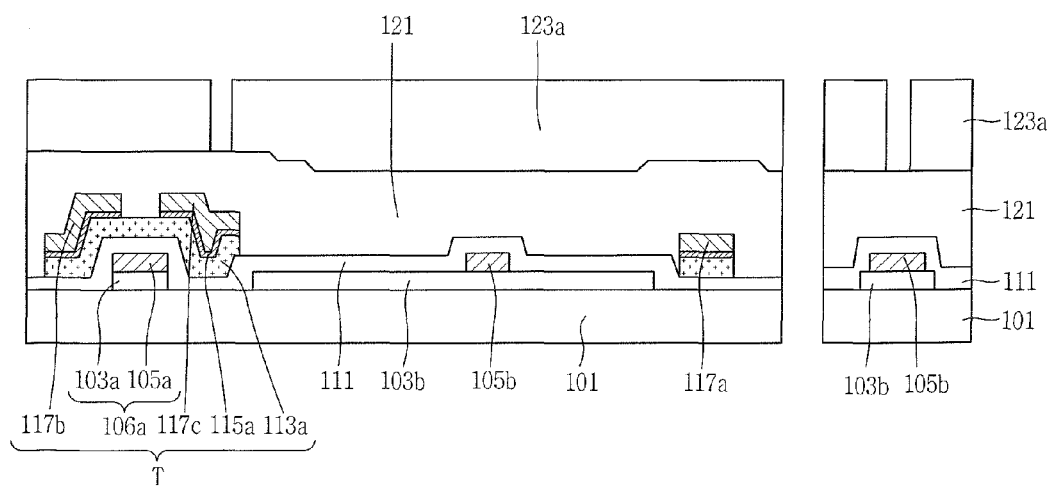
Figure 7R:
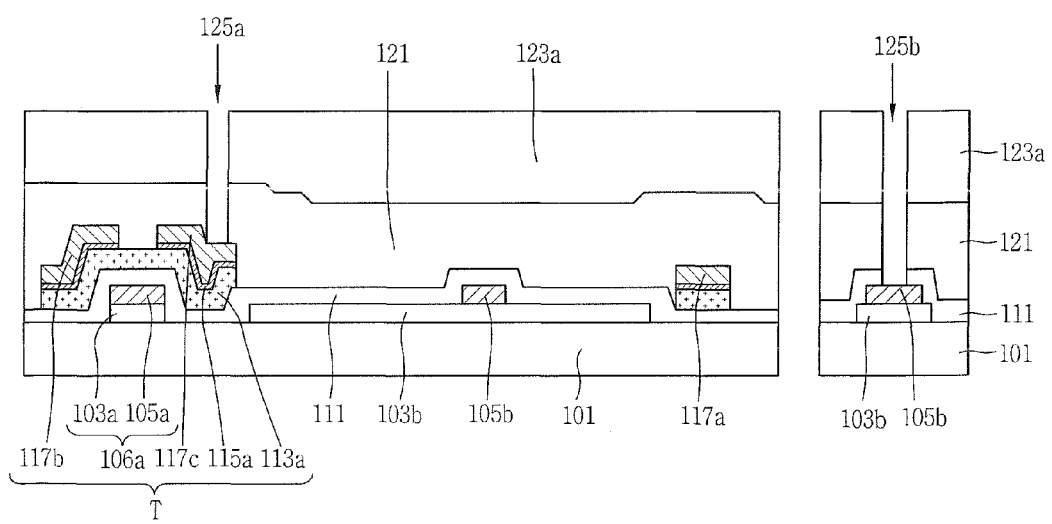
Figure 7S:
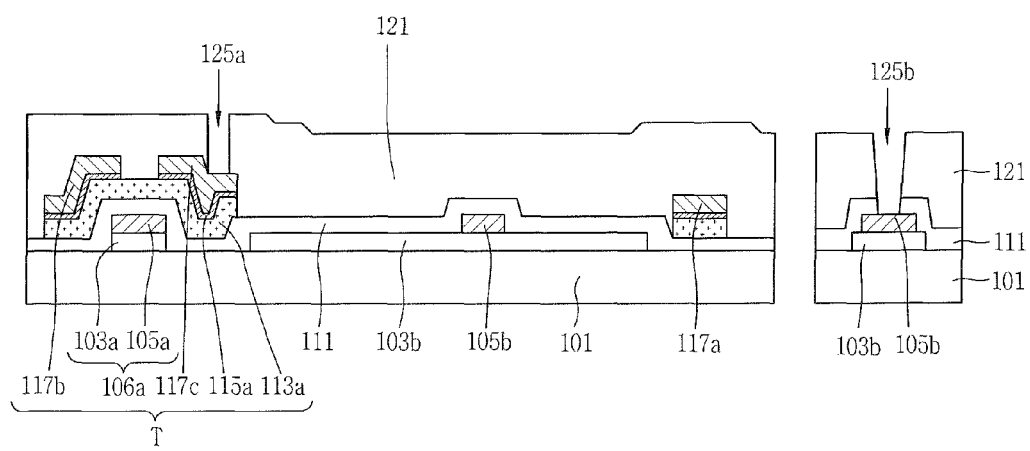
Figure 7T:
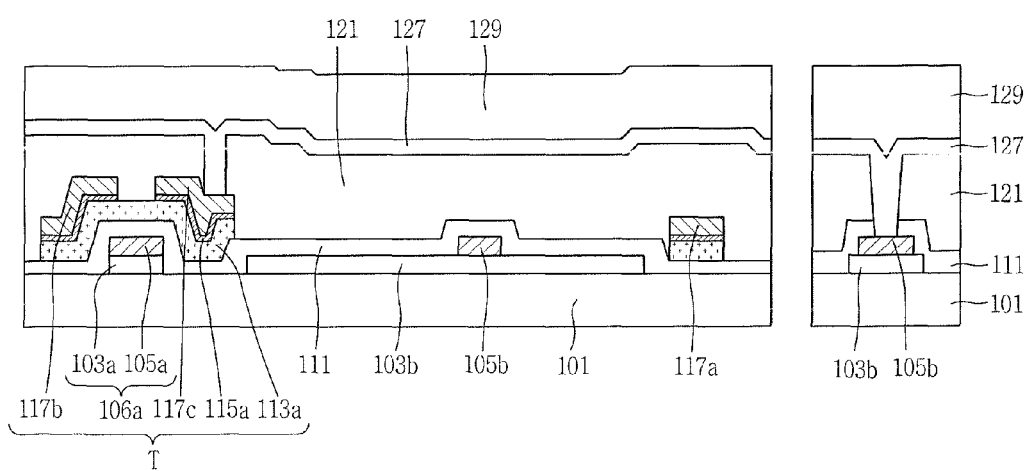
Figure 7U:
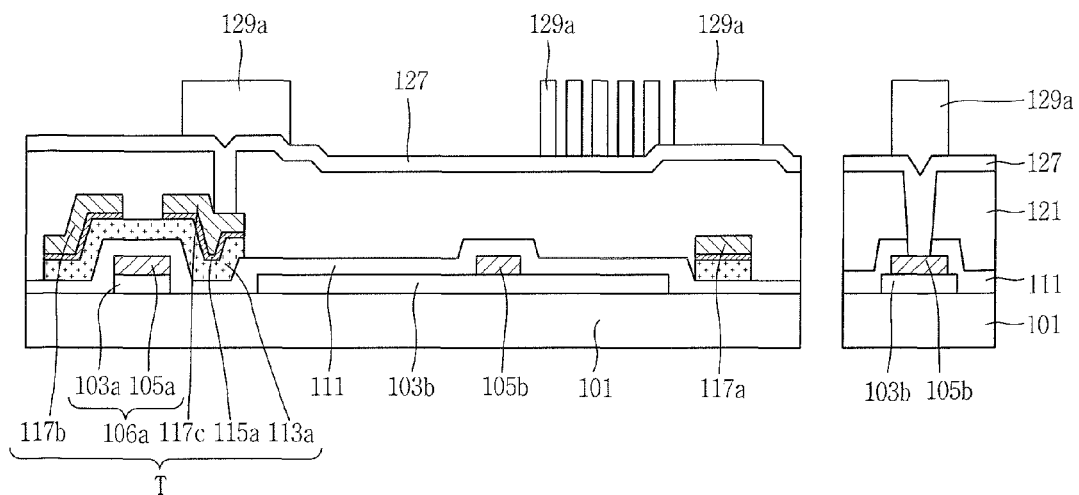
Figure 7V:
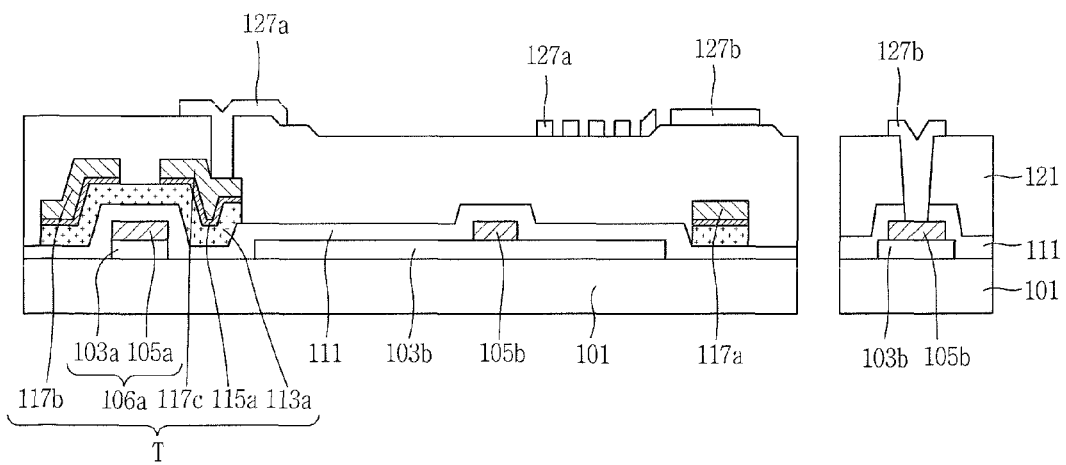

FIGS. 7A to 7V are sectional views showing the process of fabricating the array substrate for an FFS mode LCD device taken along lines VIIa to VIIa and VIIb to VIIb.

As shown in FIG. 7A, a plurality of pixel regions including a switching region and nonpixel regions are defined on the transparent substrate 101, and a first transparent conductive material layer 103 and a first conductive metal layer 105 are sequentially deposited on the transparent substrate 101 through sputtering. Here, as the first transparent conductive material layer 103, any one selected from the group consisting of transparent conductive materials including ITO and IZO is used.

Also, as the first conductive metal layer 105, a single layer made of a metallic material such as aluminum (Al), tungsten (W), copper (Cu), molybdenum (Mo), chromium (Cr), titanium (Ti), a molybdenum alloy, a copper alloy, an aluminum alloy, and the like, may be used, or a structure in which two or more layers are stacked, such as Al/Cr, Al/Mo, Al(Nd)/Al, Al(Nd)/Cr, Mo/Al(Nd)/Mo, Cu/Mo, Ti/Al(Nd)/Ti, Mo/Al, Mo alloy/Al alloy, Mo/Al alloy, Cu/Mo alloy, Cu/Mo(Ti), or the like, may be used.

As shown in FIG. 7B, a photoresist having high transmittance is coated on the first conducive metal layer 105 to form a first photosensitive film 107.

Subsequently, an exposing process is performed on the first photosensitive film 107 by using a first diffraction mask 109 including a light blocking portion 109a, a translucent portion 109b, and a transmission portion 109c. Here, the light blocking portion 109a of the first diffraction mask 109 is positioned above the first photosensitive film 107 corresponding to a gate electrode formation region and an auxiliary common line formation region, and the translucent portion 109b of the first diffraction mask 109 is positioned above the first photosensitive film 107 corresponding to a common line formation region. Here, besides the first diffraction mask 109, a mask using a diffraction effect of light, e.g., a half-tone mask, or any other masks, may be used.

Next, as shown in FIG. 7C, after the exposing process is finished, the first photosensitive film 107 is patterned through a developing process to form a first pattern 107a of the gate electrode formation region and the auxiliary common line formation region and a second pattern 107b of the common line formation region. Here, since light has not transmitted through the first pattern 107a of the gate electrode formation region and the auxiliary common line formation region, the thickness of the first photosensitive film 107 is maintained as it is, while a portion of light has transmitted through the second pattern 107b of the common line formation region, so a certain thickness of the second pattern 107b has been removed. Namely, the second pattern 107b of the common line formation region has a thickness smaller than that of the first pattern 107a of the gate electrode formation region and the auxiliary common line formation region.

Subsequently, as shown in FIG. 7D, the first conductive metal layer 105 and the first transparent conductive material layer 103 are patterned by using the first pattern 107a of the gate electrode formation region and the auxiliary common line formation region of the first photosensitive film and the second pattern 107b of the common line formation region as masks to simultaneously form a gate line (not shown) (See 106 in FIG. 4) the gate electrode 106a and the common line 103b protruded from the gate line 106. Here, the gate line (not shown) (See 106 in FIG. 4) and the gate electrode 106a include a first conductive metal layer pattern 105a and a first transparent conductive material layer pattern 103a. Also, as shown in FIG. 4, the common line 103b is formed on the entire surface of the pixel region, namely, in a space where the gate line 106 and the data line (not shown) (See 117a in FIG. 4) cross.

Thereafter, as shown in FIG. 7E, a portion of the thickness of the gate electrode 106a, a portion of the first pattern 107a in the auxiliary formation region, and the entirety of the second pattern 107b on the second conductive metal layer pattern 105b are etched through an ashing process, thus completely removing the second pattern 107b. Then, the second conductive metal pattern 105b on the common line 103b is exposed.

Subsequently, as shown in FIGS. 7F and 7G, the exposed second conductive metal layer pattern 105b is selectively removed by using the gate electrode 106a and the first pattern 107a in the auxiliary common line formation region whose thickness has been partially etched by the ashing process to form the auxiliary common line 105c on the common line 103b, the common line 103b is exposed, and then, the remaining first pattern 107a is removed. Accordingly, the auxiliary common line 105c is formed on the common line 103b. The common line 103b is made of a transparent conductive material, and the auxiliary common line 105c is made of an opaque conductive metal material.

Meanwhile, as shown in FIG. 4, the auxiliary common line 105c is formed within the blue (B) pixel region among the red (R), green (G), and blue (B) subpixel regions defined by the plurality of gate lines 106 and the plurality of data lines 117a. This is because, since the auxiliary common line 105c is formed in the blue (B) subpixel region having the lowest transmittance, the aperture ratio is additionally increased. Also, in the case in which the auxiliary common line 105c is formed at the blue (B) subpixel region having the lowest transmittance, transmittance may be degraded because the auxiliary common line 105c is made of an opaque metal material. Thus, in order to avoid this problem, the area of the blue (B) subpixel region is formed to be slightly larger than that of the red (R) pixel region and the green (G) subpixel regions.

As shown in FIG. 7H, a gate insulating layer 111 made of silicon nitride (SiNx) or silicon oxide (SiO$_2$) is formed on the entire surface of the substrate.

Subsequently, as shown in FIG. 7I, an amorphous silicon layer (a-Si:H) 113, an amorphous silicon layer (n+ or p+) 115 including impurities, and a second conductive metal layer 117 are sequentially stacked on the gate insulating layer 111. Here, the amorphous silicon layer (a-Si:H) 113 and the amorphous silicon layer (n+ or p+) 115 including impurities are deposited through a chemical vapor deposition (CVD) method, and the second conductive metal layer 117 is deposited through a sputtering method. Here, the CVD method and the sputtering method are mentioned as the deposition method, but any other deposition methods may be used according to circumstances. Here, as the second conductive metal layer 117, a single layer made of a metallic material such as aluminum (Al), tungsten (W), copper (Cu), molybdenum (Mo), chromium (Cr), titanium (Ti), a molybdenum alloy, a copper alloy, an aluminum alloy, and the like, may be used, or a structure in which two or more layers are stacked, such as Al/Cr, Al/Mo, Al(Nd)/Al, Al(Nd)/Cr, Mo/Al(Nd)/Mo, Cu/Mo, Ti/Al(Nd)/Ti, Mo/Al, Mo alloy/Al alloy, Mo/Al alloy, Cu/Mo alloy, Cu/Mo(Ti), or the like, may be used.

Thereafter, as shown in FIG. 7J, a second photosensitive film 119 having excellent transmittance is coated on the second conductive metal layer 117.

Subsequently, an exposing process is performed on the second photosensitive film 119 by using a second diffraction mask 121 including a light blocking portion 120a, a translucent portion 120b, and a transmission portion 120c. Here, the light blocking unit Here, the light blocking portion 120a of the second diffraction mask 120 is positioned above the second photosensitive film 119 corresponding to a data line formation region and a source electrode and drain electrode formation region, and the translucent portion 120b of the second diffraction mask 120 is positioned above the second photosensitive film 119 corresponding to a channel area of the TFT T, namely, the gate electrode 106a. Here, besides the first diffraction mask 120, a mask using a diffraction effect of light, e.g., a half-tone mask, or any other masks, may be used.

Next, as shown in FIG. 7K, after the exposing process is finished, a developing process is performed, and then, the second photosensitive film 119 is selectively patterned to form a first pattern 119a at the data line formation region and the source electrode and drain electrode formation region and a second pattern 119b at the channel area of the TFT T. Here, since light has not transmitted through the first pattern 119a of the data line formation region and the source electrode and drain electrode formation region, the thickness of the second photosensitive film is maintained as it is, while a portion of light has transmitted through the second pattern 119b of the channel region of the TFT T, so a certain thickness of the second pattern 119b has been removed. Namely, the second pattern 119b of the channel region of the TFT T has a thickness smaller than that of the first pattern 119a of the data line formation region and the source electrode and the drain electrode formation region.

Subsequently, as shown in FIG. 7L, the second conductive metal layer 117, the amorphous silicon layer 115 containing impurities, and the amorphous silicon layer 113 are selectively patterned by using the first pattern 119a of the data line formation region and the source electrode and drain electrode formation area and the second pattern 119b of the channel region of the TFT T as masks to form the data line 117a, and the active layer 113a and define a source electrode formation region, a drain electrode formation region, and an ohmic-contact layer formation region.

Thereafter, as shown in FIG. 7M, an ashing process is performed to remove a portion of the thickness of the first pattern 119a of the data line formation region and the source electrode and drain electrode formation region and the entirety of the second pattern 119b of the channel region of the TFT T are removed to expose a portion of the second conductive metal layer 117 under the second pattern 119b of the channel region of the TFT T.

Subsequently, as shown in FIG. 7N, the exposed portion of the second conductive metal layer 117 is etched by using the first pattern 119a of the data line formation region and the source electrode and drain electrode formation region, of which a portion of the thickness has been etched through an ashing process, as a mask to form the source electrode 117b and the drain electrode 117c spaced apart from the source electrode 117b.

Thereafter, the portion of the amorphous silicon layer 115 including impurities at the channel region is also removed through an etching process to from the ohmic-contact layer 115a exposing the channel region of the active layer 113a.

Subsequently, as shown in FIG. 7O, the remaining first pattern 119a is removed, and the protective film 121 formed of the nitride silicon layer (SiNx) or silicon oxide film (SiO$_2$) on the entire surface of the substrate.

Thereafter, as shown in FIG. 7P, photoresist having high transmittance is coated on the protective film 121 to form a third photosensitive film 123.

Subsequently, as shown in FIG. 7Q, the third photosensitive film 123 is exposed and developed through a photolithography processing technique using a mask (not shown), and then, selectively patterned to form a third photosensitive film pattern 123a.

Thereafter, as shown in FIG. 7R, the protective film 121 is selectively removed by using the third photosensitive film pattern 123a as a mask to form a drain electrode contact hole 125a exposing the drain electrode 117c and simultaneously form an auxiliary common line contact hole 125b exposing the auxiliary common line 105c positioned at the blue (B) subpixel region.

Subsequently, as shown in FIGS. 7S and 7T, the third photosensitive film pattern 123a is removed, a second transparent conductive material layer 127 is deposited on the protective film 121 including the drain electrode contact hole 125a and the auxiliary common line contact hole 125b, and a fourth photosensitive film 129 is coated on the second transparent conductive material layer 127.

Thereafter, as shown in FIG. 7U, the fourth photosensitive film 129 is exposed and developed through a photolithography processing technique using a mask (not shown) and selectively patterned to form a fourth photosensitive film pattern 129a.

Subsequently, as shown in FIG. 7V, the second transparent conductive material layer 127 is selectively patterned by using the fourth photosensitive film pattern 129a as a mask to simultaneously form a plurality of pixel electrodes 127a which are spaced apart and a common electrode 127b surrounding the plurality of pixel electrodes 127a. Here, the pixel electrodes 127a overlaps with a lower common line 103b, and the common electrode 127b overlaps with the gate line 106 and the data line 117a.

Thus, the pixel electrodes 127a are positioned at the uppermost layer, and at the same time, the common electrode Vcom 127b is formed above the data line 117a, whereby the pixel electrodes 127a perform FFS driving with the lower common line 103b, and the pixel electrode 127a positioned at the outermost portion among the pixel electrodes 127a and the common electrode 127b on the data line 117a perform IPS driving.

Also, the common electrode 127b is connected with the lower auxiliary common line 105c through the contact hole 121b formed only at the blue (B) subpixel having the lowest transmittance, thus maximizing the aperture ratio. Here, the blue (B) subpixel has a lower transmittance than that of the red (R) and green (G) subpixels, so in order to compensate the lower transmittance to a degree, the blue (B) subpixel is formed to have a slightly larger area than the red (R) and green (G) subpixels. Namely, when the auxiliary common line 105c is formed a the blue (B) subpixel region having the lowest transmittance, transmittance may be degraded because the auxiliary common line 105c is made of an opaque metal material. Thus, in order to avoid this problem, the area of the blue (B) subpixel region is formed to be slightly larger than that of the red (R) pixel region and the green (G) subpixel regions.

Also, both ends of the plurality of pixel electrodes 127a are connected by a pixel electrode connection line (not shown), and both ends of the plurality of common electrodes 127b are formed by the common electrode connection line (not shown).

Thereafter, although not shown, the fourth photosensitive film pattern 129a is removed, thus completing the process of fabricating the array substrate of the FFS mode LCD device.

Thereafter, although not shown, a process of fabricating a color filter substrate and a process of filling a liquid crystal layer between the array substrate and the color filter substrate are performed to fabricate the FFS mode LCD device according to an embodiment of the present invention.

As described above, according to embodiments of the present invention, in the array substrate for an FFS mode LCD device and a fabrication method thereof, a common line, instead of a pixel electrode, is disposed at the lower most end, and the auxiliary common line Vcom disposed at an upper end of the common line is moved to an electrode bent portion having low transmittance due to generated disclination, thereby removing the necessity of a distance between the gate line and the common line, enhancing the aperture ratio, and after the gate lines are formed, a short of the common line and the gate lines can also be inspected.

Also, according to embodiments of the present invention, in the array substrate for an FFS mode LCD device and a fabrication method thereof, since the pixel electrode is positioned on the uppermost layer, and at the same time, the common electrode Vcom is formed on the data lines, whereby the pixel electrodes perform FFS driving with the underlying common line and the outermost pixel electrode and the common electrode on the data lines perform IPS driving.

According to embodiments of the present invention, in the array substrate for an FFS mode LCD device and a fabrication method thereof, a contact hole allowing the common electrode and the auxiliary common line at the lower end to be in contact is formed only at the blue subpixels having the lowest transmittance, thus maximizing the aperture ratio.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. An array substrate for a fringe field switching (FFS) mode liquid crystal display (LCD) device, the array substrate comprising:
    a plurality of gate lines in one direction on one surface of the substrate;
    a plurality of data lines arranged to cross the plurality of gate lines to define subpixel regions;
    a common line at the subpixel regions of the substrate;
    an auxiliary common line on the common line and disposed to be parallel to the gate lines;
    thin film transistors (TFTs) at crossings of the gate lines and the data lines;
    a protective film on the entire surface of the substrate and exposing the TFTs and the auxiliary common line; and
    a pixel electrode and a common electrode on the protective film and connected with the TFTs and the auxiliary common line, respectively,
    wherein the pixel electrodes overlap with the common line and the common electrodes overlap with the gate line and the data line; and
    wherein the common electrode on the data line is connected with the auxiliary common line through a contact hole only at a blue (B) subpixel region among a red (R) subpixel region, a green (G) subpixel region, and the blue (B) subpixel region.

2. The array substrate of claim 1, wherein the area of the blue (B) subpixel region where the auxiliary common line connected with the common electrode is formed is larger than the area of the red (R) subpixel region and the green (G) subpixel region.

3. The array substrate of claim 1, wherein the auxiliary common line is made of the same material as that of the gate line formation material.

4. The array substrate of claim 1, wherein the pixel electrode and the common electrode are made of the same material.

5. The array substrate of claim 1, wherein the auxiliary common line is disposed to be parallel to the gate line, and disposed to be perpendicular to the pixel electrode.

6. The array substrate of claim 1, wherein the neighboring pixel electrodes perform FFS driving with the common line, and the outermost pixel electrode, among the pixel electrodes, and the common electrode perform In-Plane Switching (IPS) driving.

7. A method for fabricating an array substrate for a fringe field switching (FFS) mode liquid crystal display (LCD) device, the method comprising:
    forming a plurality of gate lines and a common line in one direction on one surface of the substrate and simultaneously forming an auxiliary common line to be parallel to the gate lines on the common line;
    forming a plurality of data lines arranged to cross the plurality of gate lines to define pixel regions;
    forming thin film transistors (TFTs) at crossings of the gate lines and the data lines;
    forming a protective film on the entire surface of the substrate such that it exposes the TFTs and the auxiliary common line; and
    forming pixel electrodes and common electrodes connected with the TFTs and the auxiliary common line, respectively, on the protective film,
    wherein the pixel electrodes overlap with the common line and the common electrodes overlap with the gate line and the data line; and
    wherein the common electrode on the data line is connected with the auxiliary common line through a contact hole only at a blue (B) subpixel region among a red (R) subpixel region, a green (G) subpixel region, and the blue (B) subpixel region.

8. The method of claim 7, wherein the area of the blue (B) pixel region where the auxiliary common line connected with the common electrode is formed is larger than the area of the red (R) pixel region and the green (G) pixel region.

9. The method of claim 7, wherein the auxiliary common line is made of the same material as that of the gate line formation material.

10. The method of claim 7, wherein the pixel electrode and the common electrode are made of the same material.

11. The method of claim 7, wherein the auxiliary common line is disposed to be parallel to the gate line, and disposed to be perpendicular to the pixel electrode.

12. The method of claim 7, wherein the neighboring pixel electrodes perform FFS driving with the common line, and the outermost pixel electrode, among the pixel electrodes, and the common electrode perform In-Plane Switching (IPS) driving.

13. The method of claim 7, wherein the gate line, the common line, and the auxiliary common line are formed through a photolithography process and an ashing process using a first diffraction mask, and the data line and the TFT are formed through a photolithography process and an ashing process using a second diffraction mask.

14. The method of claim 7, wherein both ends of the pixel electrodes are connected by a pixel electrode connection line, and both ends of the common electrodes are connected by a common electrode connection line.

15. The array substrate of claim 1, wherein the common electrode surrounds but does not overlap the pixel electrode in plan view.

16. The method of claim 7, wherein the common electrode surrounds but does not overlap the pixel electrode in plan view.

17. The array substrate of claim 15, wherein the common electrode and the pixel electrode are both formed directly on the protective film.

18. The array substrate of claim 16, wherein the common electrode and the pixel electrode are both formed directly on the protective film.

* * * * *